(12) United States Patent
Hoelke et al.

(10) Patent No.: US 8,841,186 B2
(45) Date of Patent: Sep. 23, 2014

(54) MANUFACTURING OF A SEMICONDUCTOR DEVICE AND CORRESPONDING SEMICONDUCTOR DEVICE

(75) Inventors: Alexander Hoelke, Sarawak (MY); Deb Kumar Pal, Sarawak (MY); Kia Yaw Kee, Sarawak (MY); Yang Hao, Sarawak (MY)

(73) Assignee: X-Fab Semiconductor Foundries AG, Erfurt (DE)

( * ) Notice: Subject to any disclaimer, the term of this patent is extended or adjusted under 35 U.S.C. 154(b) by 0 days.

(21) Appl. No.: 13/582,142

(22) PCT Filed: Mar. 4, 2010

(86) PCT No.: PCT/IB2010/050949
§ 371 (c)(1),
(2), (4) Date: Aug. 31, 2012

(87) PCT Pub. No.: WO2011/107832
PCT Pub. Date: Sep. 9, 2011

(65) Prior Publication Data
US 2012/0319193 A1 Dec. 20, 2012

(51) Int. Cl.
*H01L 21/336* (2006.01)
*H01L 29/78* (2006.01)
*H01L 29/06* (2006.01)
*H01L 29/10* (2006.01)
*H01L 21/265* (2006.01)
*H01L 29/66* (2006.01)
*H01L 29/423* (2006.01)

(52) U.S. Cl.
CPC ...... *H01L 21/26586* (2013.01); *H01L 29/0634* (2013.01); *H01L 29/1033* (2013.01); *H01L 29/0696* (2013.01); *H01L 29/4236* (2013.01); *H01L 29/66659* (2013.01); *H01L 29/7835* (2013.01)

USPC ............. 438/270; 257/330; 257/E29.262; 257/E21.41

(58) Field of Classification Search
USPC ............ 257/330, E29.262, E21.41; 438/270
See application file for complete search history.

(56) References Cited

U.S. PATENT DOCUMENTS
5,216,275 A 6/1993 Chen
5,459,085 A 10/1995 Pasen et al.
(Continued)

OTHER PUBLICATIONS
Leonard Rubin et al., "Ion Implantation in Silicon Technology", The Industrial Physicist, Jun./Jul. 2003, pp. 12 to 15, American Institute of Physics.
(Continued)

*Primary Examiner* — Matthew W Such
*Assistant Examiner* — Monica D Harrison
(74) *Attorney, Agent, or Firm* — Duane Morris LLP

(57) ABSTRACT

The disclosed method of manufacturing (110, 120, 130, 140) a semiconductor device (12) has the steps (112, 114, 116) of: forming at least one wall (33) of a body (44) of the semiconductor device (12) by etching at least one trench (22) for a gate (42) of the semiconductor device (12) into the body (44); and performing a slanted implantation doping (126, 128) into the at least one wall (33) of the body (44), after the etching (112) of the at least one trench (22) and prior to coating the at least one trench (22) with an insulating layer (29). A semiconductor device (12) comprises at least one trench (22) for a gate (42) of the semiconductor device (12); and a body (44) having at least one wall (33) of the at least one trench (22), wherein a deviation (64) of a doping concentration (62) along a distance (66) in depth-direction (do) of the at least one trench (22) in a surface (33) of the at least one wall (33) is less than ten percent of a maximum value (68) of the doping concentration (62) along the distance (66).

16 Claims, 11 Drawing Sheets

(56) References Cited

U.S. PATENT DOCUMENTS

| | | | |
|---|---|---|---|
| 5,861,104 | A | 1/1999 | Omid-Zohoor |
| 5,936,285 | A | 8/1999 | Pasch et al. |
| 6,020,244 | A | 2/2000 | Thompson et al. |
| 6,316,806 | B1 * | 11/2001 | Mo ................................ 257/330 |
| 6,833,585 | B2 | 12/2004 | Kim et al. |
| 6,835,993 | B2 | 12/2004 | Sridevan et al. |
| 7,023,050 | B2 | 4/2006 | Salama et al. |
| 7,511,337 | B2 * | 3/2009 | Rouh et al. ................ 257/330 |
| 2002/0048913 | A1 | 4/2002 | Finney |
| 2004/0178430 | A1 | 9/2004 | Rhodes et al. |
| 2004/0180500 | A1 | 9/2004 | Metzler |

OTHER PUBLICATIONS

US PTO—ISA/US—International Search Report, dated Jul. 15, 2010, (PCT/IB2010/050949).

Wanjun Chen, Bo Zhang, Zhaoji Li, "Optimization of Super-Junction SOI-LDMOS with a Step Doping Surface-Implanted Layer", Semiconductor Science and Technology, IOP Publishing Ltd., 2007, pp. 464-470, vol. 22.

Chenming Hu, "Optimum Doping Profile for Minimum Ohmic Resistance and High-Breakdown Voltage", IEEE Transactions on Electron Devices, Mar. 1979, pp. 243-244, vol. ED-26, No. 3.

Sameh G. Nassif-Khalil, Li Zhang Hou, C. Andre T. Salama, "SJ/RESURF LDMOST", IEEE Transactions on Electron Devices, Jul. 2004, pp. 1185-1191, vol. 51, No. 7.

Akio Nakagawa, Yusuke Kawaguchi, "Improved 20V Lateral Trench Gate Power MOSFETs with Very Low On-resistance of 7.8 mΩmm2", ISPSD'2000, 2000 IEEE, Catalog No. 00CH37094C.

Y. Onishi, H. Wang, H. P. E. Xu, W. T. Ng, R. Wu, J. K. O. Sin, "SJ-FINFET: A New Low Voltage Lateral Superjunction MOSFET", Proceedings of the 20th International Symposium on Power Semiconductor Devices & IC's, 2008 IEEE, May 18-22, 2008, pp. 111-114, Oralando, FL.

* cited by examiner

US 8,841,186 B2

MANUFACTURING OF A SEMICONDUCTOR DEVICE AND CORRESPONDING SEMICONDUCTOR DEVICE

The invention concerns a method of manufacturing of a semiconductor device. A corresponding semiconductor device is concerned as well—independent of its manufacturing, but claimed in steps of the method of manufacturing.

BACKGROUND ART

U.S. Pat. No. 6,835,993 B2 describes a super-junction semiconductor device having a trench gate structure and a drift region formed atop a substrate. The drift region comprises a stack of thin layers alternating in conductivity type. The trench gate structure includes at least one trench and extends between a first wall and a second wall of the trench. A gate oxide lines the interior of the trench, and a conductive gate material fills the remaining volume of the trench. A source diffusion is arranged adjacent the first wall of the trench. The second wall of the trench extends along a first end of the drift region, and a drain diffusion is arranged adjacent a second end of the drift region. A source contact and a drain contact are connected to source and drain diffusions, respectively. An application of a potential to the conductive gate material enables conduction between source and drain electrodes through a conduction path of said gate structure.

SUMMARY OF THE INVENTION

An object of the present invention is the provision of a cost-efficient manufacturing method for a trench gate semiconductor device having a high breakdown voltage $V_{BD}$ and a low on-resistance $R_{ON}$.

This object is solved by a method of manufacturing a semiconductor device comprising the steps of: forming at least one wall of a body of the semiconductor device by etching at least one trench for a gate of the semiconductor device into the body and performing a slanted implantation doping into the at least one wall of the body, after the etching of the at least one trench and prior to coating the at least one trench with an insulating layer (claim 1).

Typically, the trench gate semiconductor device comprises a super-junction. The first and second walls of the background art as set out above may be considered as front and rear walls of the trench, wherein "at least one wall of the body" as defined by the present invention may typically be considered as one of the two other walls, i.e. lateral walls of the trench. The slanted implantation doping may be performed by directing a beam of doping material to a surface of the at least one wall of the body. An opening plane of the trench may be defined such that the circumferential top edge of the opening of the trench lies in the opening plane. Then, an absolute value of a tilt angle between a perpendicular of the opening plane and a direction of the beam may be greater than 0° and less than 90°. The tilt angle may be greater than 5°, in particular greater than 10°, in particular greater than 20°, in particular greater than 30°. Further, the tilt angle may be smaller than 75°, in particular smaller than 60°, in particular smaller than 45°. An absolute value of the difference of 90° minus an angle between a perpendicular of the surface of the at least one wall of the body and the perpendicular of the opening plane may be less than 20°, in particular less than 10°, in particular less than 5°.

A further object of the present invention is the provision of a semiconductor device having a high breakdown voltage and a low on-resistance $R_{ON}$, wherein the semiconductor device can be manufactured cost-efficiently.

This object of the present invention is solved by providing a semiconductor device comprising: at least one trench for a gate of the semiconductor device; and a body having at least one wall of the at least one trench, wherein a deviation of a doping concentration along a distance in depth-direction of the at least one trench in a surface of the at least one wall is less than ten percent of a maximum value of the doping concentration along the distance (claim 11).

The object of the present invention is also solved by providing a semiconductor device comprising: at least one trench for a gate of the semiconductor device; and a body having at least one wall of the at least one trench, wherein a deviation of a doping concentration inside a volume of the at least one wall along a distance transverse or in parallel to a depth-direction of the at least one trench is less than ten percent of a maximum value of the doping concentration inside the volume of the at least one wall along the distance (claim 13).

BRIEF DESCRIPTION OF THE DRAWINGS

The drawings support, explain and enhance the invention as claimed, but is not the invention as such. This is explained in the general part of the description and the claims.

PREFERRED EMBODIMENTS

Figure 1:
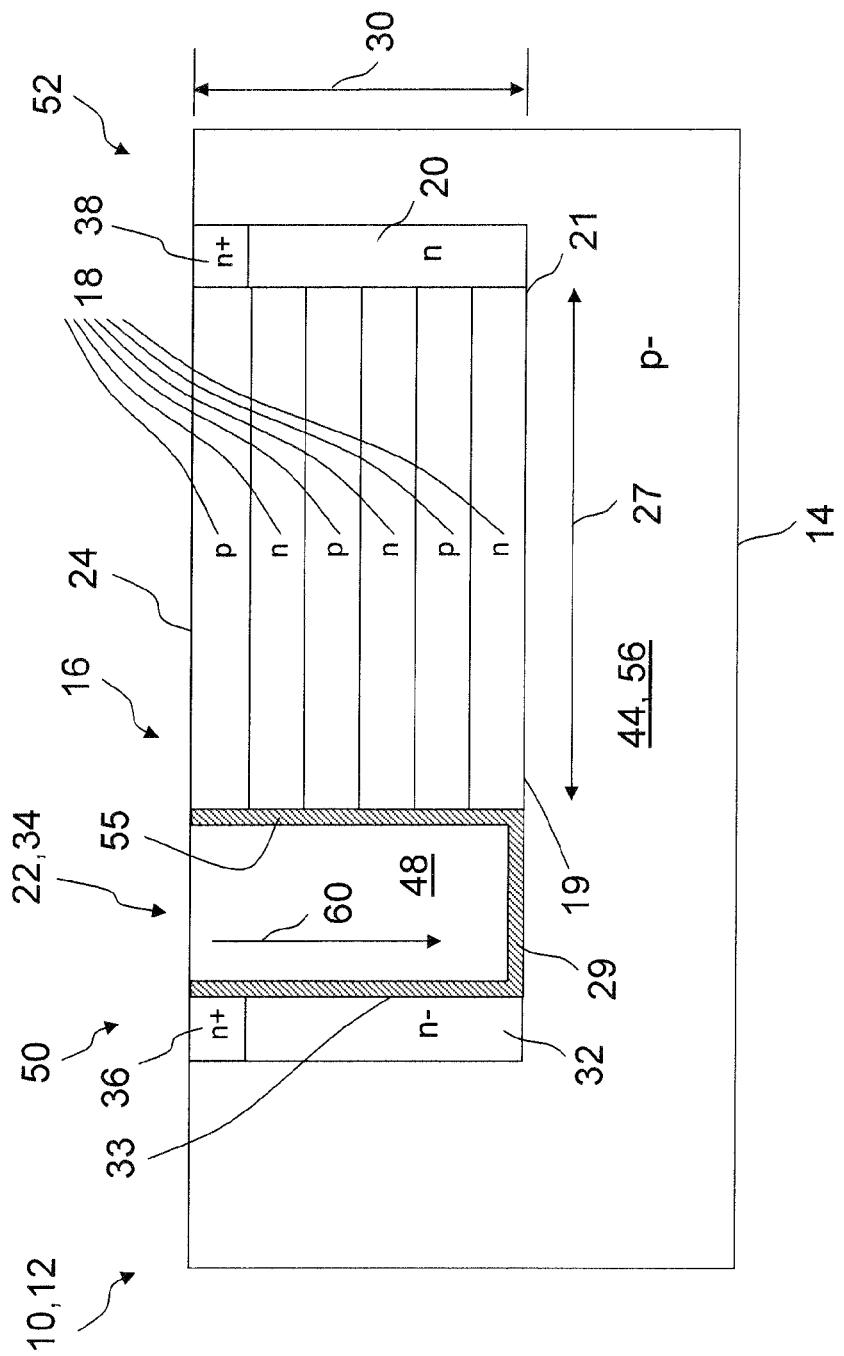
FIG. 1 shows schematically a cross-section of an example n-channel lateral trench gate transistor (trench gate NLDMOS) having a super-junction.

FIG. 1 shows schematically a cross-section 10 of an example embodiment of an n-channel lateral trench gate transistor 12 (trench gate NLDMOS).

For manufacturing a DMOSFET a double-diffusion process may be employed to obtain p and n$^+$ regions, hence the name double diffused. The semiconductor device 12 may be formed upon a high-resistivity p-type substrate 14 having a resistivity of preferably about 50 Ωcm. A drift region 16 comprising alternating n type and p type layers 18 may be provided on a top surface 19 of the substrate 14 either by means of epitaxy or ion implantation or a combination thereof. The stack of alternating n type and p type layers 18 may be called "super-junction".

The super-junction 16 allows increasing a doping concentration while keeping a is breakdown voltage $V_{BD}$ high. The breakdown voltage $V_{BD}$ may be defined as a maximum voltage that can be applied between the drain region 20 and the source region 32 in a blocking mode of the MOSFET 12 before a drain to source current Id increases heavily. The layering of the layers 18 may be perpendicularly-oriented or transversely-oriented in relation to the top surface 19 of the substrate 14. Each layer 18 of the drift region 16 has a dose of approximately $10^{12}$ atoms*cm$^{-2}$ and may be approximately 0.2 to 5.0 μm thick. A relatively low-resistivity n type drain region 20 may be created at a first end 21 of the drift region 16.

Trenches 22 extend into the substrate 14 and are etched into the top surface 24 of the drift region 16.

The trenches 22 are separated from n type drain region 20 by a length 27 of the drift region 16. For forming an insulating layer 29, the trenches 22 may be lined with a gate oxide 29. The source region 32 is located on the far side of trench 22 (seen from the n type drain region 20). The source region 32 is typically doped n to about $10^{17}$ to $10^{22}$*cm$^{-3}$ up to a trench depth 30 of approximately 2.3 μm to create an n body source region 32.

A conductive gate electrode 34 (made of conductive polysilicon or metal) may be provided in the trench 22. The conductive gate electrode 34 may be insulated from the drift region 16 by the insulating layer 29. High dose low energy implants (dose measured in atoms/cm$^2$ and energy measured in keV) are performed in the top surface of the source region 32 to form shallow, extremely low-resistivity n$^+$ source region 36. This, if the concentration of regions 32 is less than $10^{18}$*cm$^{-3}$. Also, in the top surface of the n type drain region 20 high dose low energy implants are performed to form shallow, extremely low-resistivity n$^+$ drain region 38. This, if drain region 20 has a concentration of less than $10^{18}$*cm$^{-3}$.

Figure 2:
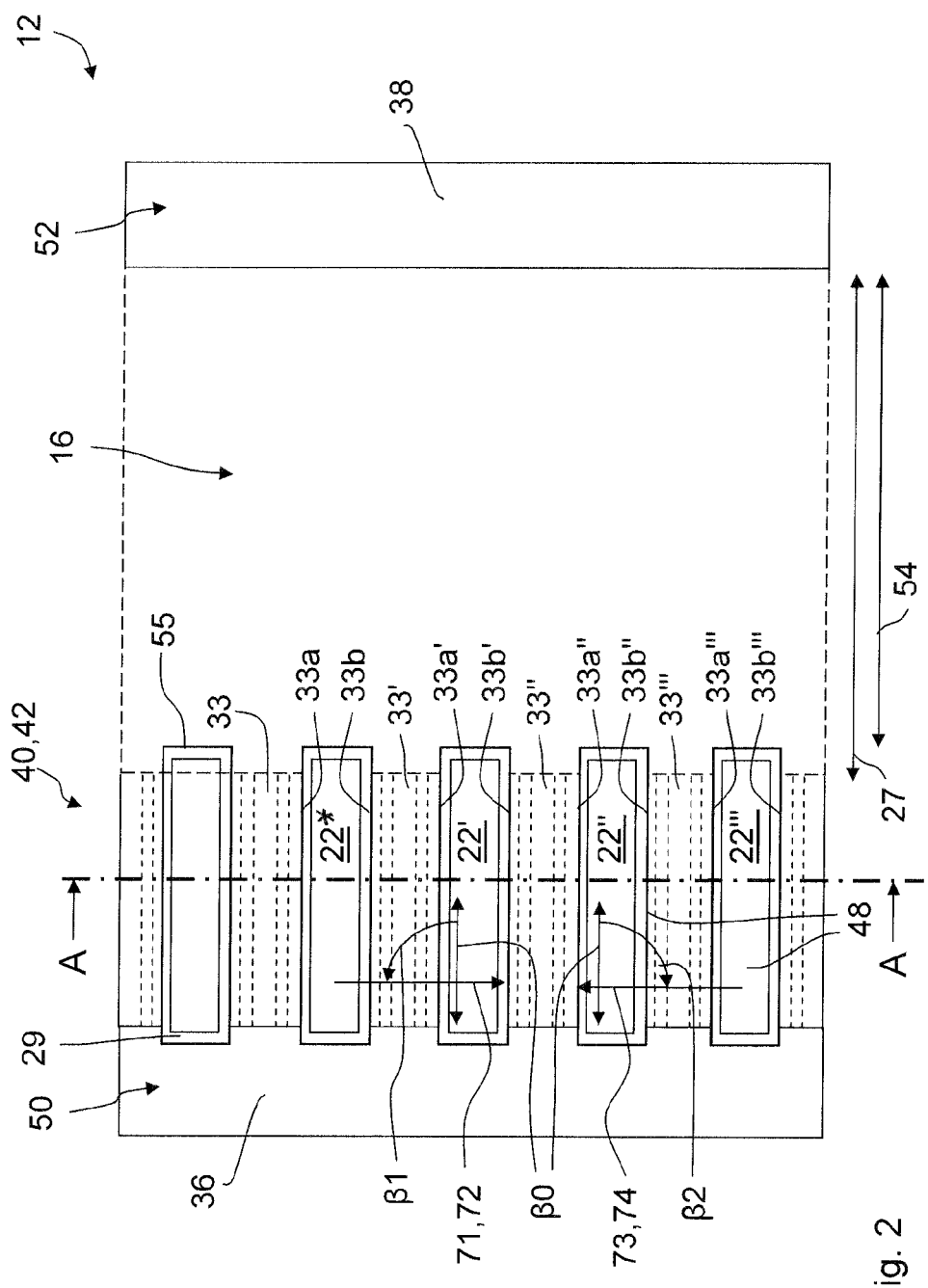
FIG. 2 shows schematically a top view of the example transistor.

FIG. 2 shows schematically a top view of the example transistor 12. Therein, an array 40 of lateral trench gates 42 connects the source region 32 (see FIG. 1) to the drift region 16. The drift region 16 connects the array 40 of lateral trench gates 42 to the n type drain region 20 (see FIG. 1). The array 40 of lateral trench gates 42 comprises at least one wall 33 made of the semiconductor body 44 (see FIG. 1) and at least one trench 22. Inside the trench 22, inner faces 33a, 33b of the at least one trench 22, which are outside surfaces 33a, 33b of the wall 33, may be coated with an insulating layer 29. Remaining inside volume 48 (see FIG. 1) of the trench 22 may be filled with a conductive material, e.g. conductive polysilicon or metal. Generally, many lateral trench gates 42 are connected in parallel to achieve a large on-state drain current Id and a low on-resistance $R_{ON}$. To reduce a spreading resistance from the surface channel to the extremely low-resistivity source region 36, the trench 22 may overlap with the extremely low-resistivity source region 36 (n$^+$ diffusion layer).

In a blocking mode the source 50 (source region 32) and the gate electrode 34 are grounded with respect to the substrate 14 and a high relative bias may be applied to the drain 52 (n type drain region 20). Then, the voltage in the lateral direction 54 is supported entirely in the drift region 16. The walls 55 of the trenches 22 facing the n type drain region 20 are held to a potential close to that of the substrate 14. The drift region 16 depletes out completely allowing an almost uniform electric field distribution along its length 27.

When a positive gate voltage $V_g$ is applied with respect to the source 50, an electric field is generated which penetrates through the insulating layer 29. Caused by the electric field, majority carriers (which with p silicon are holes) from adjacent to the insulating layer 29, a layer of p type body 44 is depleted and forms a depletion layer.

When the gate voltage $V_g$ exceeds the threshold voltage $V_{th}$ the depletion becomes such high that electrons from source 60 migrate through barrier to depletion layer as well as thermally generated electrons from p type body 44 also appear in depletion layer and form a conductive channel between source 32 and drain region 20. This state is called "strong inversion". Thereby, carriers are allowed to flow from source region 32 to drain region 20. The application of a small bias to the drain 52 causes a drain current $I_d$ flowing through the semiconductor device 12. At this low bias the drift region 16 is not depleted, and hence the drain current Id can flow from the drain 52 into the drift region 16 and then laterally through surfaces 33a, 33b of the walls 33 of the trenches 22 through the surface channel into source region 32 and then into the extremely low-resistivity source region 36. The conducting channel extends between the source region 32 and the drain region 20. The drift region 16 provides in the on-state a large effective channel path. Hence, the semiconductor device 12 conducts with very low on-resistance $R_{ON}$. The current Id is conducted through the conducting channel as long as voltage is applied between source region 32 and drain region 20. Hence, a conductivity of the n type surface channel can be modulated by application of bias $V_g$ to the gate electrode 34. Of the drift region 16 only the n columns contribute to the current conduction in the on-state.

In order to switch-off the MOSFET, the gate electrode 34 may be discharged by shorting it to the source region 32. For gate voltages Vg below the threshold voltage $V_{th}$ the channel is lightly populated, and only a very small leakage current can flow between drain region 20 and source region 32. The layers 18 of the super-junction drift region 16 mutually deplete in the off-state. Hence, the super-junction drift region 16 facilitates a high breakdown voltage $V_{BD}$ and, due to the multitude of conducting n type paths, simultaneously facilitates a low on-resistance $R_{ON}$ in on-state.

The trench 22 reaches as long as trench depth 30. In other words, the width 30 of a lateral trench gate 42 lies in a vertical depth-direction $\alpha_0$ (alpha$_o$) of the trench 22. For the present invention, the term "vertical" is employed to designate a direction in line or in parallel with the depth-direction $\alpha_0$. If the doping concentration 62 (see FIG. 8) along the surface 33a, 33b of the side wall 33, i.e. along the surface channel of the transistor 12, varies, the different portions of the surface channel will have a different threshold voltage $V_{th}$ and turn on at different voltages.

An $I_d$-$V_g$ plot (transfer characteristics) will become smeared. Therefore, a uniform doping concentration 62 in the depth-direction $\alpha_0$ along the surfaces of the walls 33 of the trenches 22 of the semiconductor device 12 may be required. Thereby, a gate control comparable to a planar gate transistor may be achieved. Standard well formation techniques such as diffusion and ion implantation are not uniform vertically. These techniques typically create Gaussian vertical doping profiles or combinations of Gaussian profiles. Moreover, punch-through and snap-back engineering requires high doping concentration 63 of a volume of the walls 33. Punch-through is an extreme case where the depletion layers around the n type drift region 16 and the source region 32 merge into a single depletion region. With punch-through the field at the lateral trench gate 42 becomes strongly dependent on the drain to source voltage, as is the drain current $I_d$. This effect is undesirable, as it increases the output conductance and limits the maximum operating voltage of the MOSFET. A phenomenon called "snap-back" causes a junction breakdown at a voltage level substantially below a rated device breakdown voltage $V_{BD}$ when the gate is on—by triggering a bipolar action between source-body and drift. Because $V_{th}$ is determined by the uniform volume doping concentration 62, adjusting the punch-through and snap-back parameters changes the threshold voltage $V_{th}$, and vice versa. What is needed is an independent adjustability of the punch-through, snap-back, and $V_{th}$ parameters. Prior art lateral trench gate devices use conventional body doping techniques such as ion implantation and diffusion.

Figure 3A:
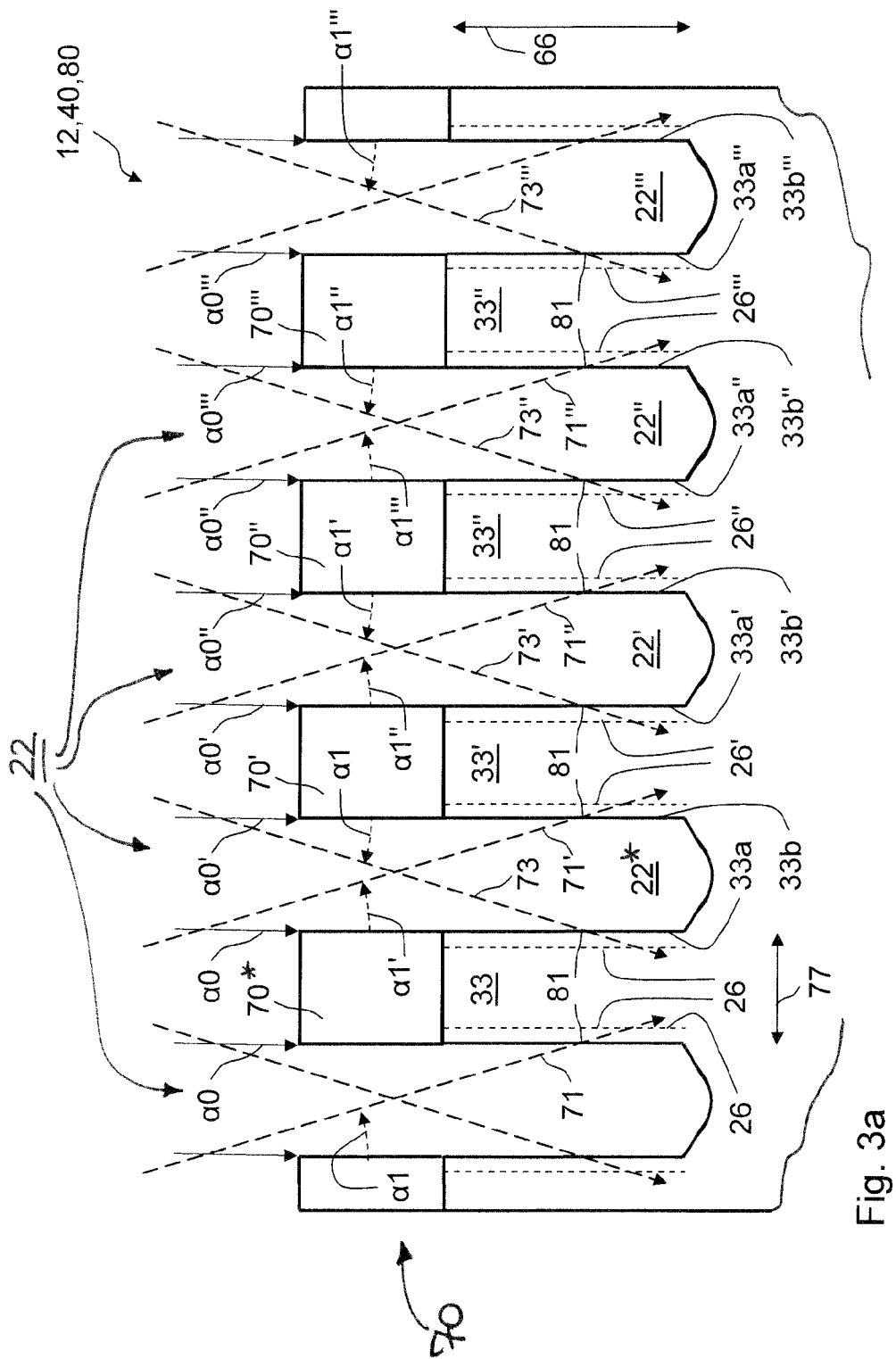
FIG. 3a shows schematically a cross-section through an array of lateral trench gates along cut line A of FIG. 2, wherein each of the walls has a first implantation doping.

FIG. 3a shows schematically a cross-section 80 along line A of FIG. 2 through the array 40 of lateral trench gates. The cross-section 80 may be perpendicular to the cross-section 10 of FIG. 1. Further, the cross-section 80 may be perpendicular to the top view of FIG. 2. The array 40 of lateral trench gates 42 is shown with a top mask 70 for the step 112 of etching the trenches 22. The trenches 22 are commonly referred to, but comprise trenches 22*,22',22",22'". The same applies for the mask 70. The portions 70*,70',70",70'" are outside the trench upper openings. The ion beams 71, 73 are used for doping the walls 33 of the trenches 22 in a first step of implantation doping 126 using a first energy. For adjusting the surface doping 26 of the lateral trench gate 42 and thus $V_{th}$, the first implantation 126 may be performed at lower energies. The implantation doping step 126 may be performed immediately after the etching 112 of the trenches 22 into the body 44. The ion beams 71, 73 of the first implantation doping 126 may be focused to a first region 81 of the surface 33a, 33b of each wall 33. The step 114 of implantation doping may comprise an ion implantation. The step 114 of performing the implantation doping 126, 128 into the wall 33 may comprise a first 126 and a second 128 step of implantation doping.

The masking layer 70, which was used for the etching 112 of the trenches 22, may or may not be used as an implantation doping mask 70. The top mask 70 may be a hard mask and a deposition is done by CVD oxide deposition. The top mask may, however, be differently designed. If the top mask 70 is done by a photo resist then it is removed before an oxide is grown or deposited on the trench. If the top mask 70 is a hard mask, then a grown oxide thickness on hard mask is very small as compared to the trench silicon.

Figure 3B:
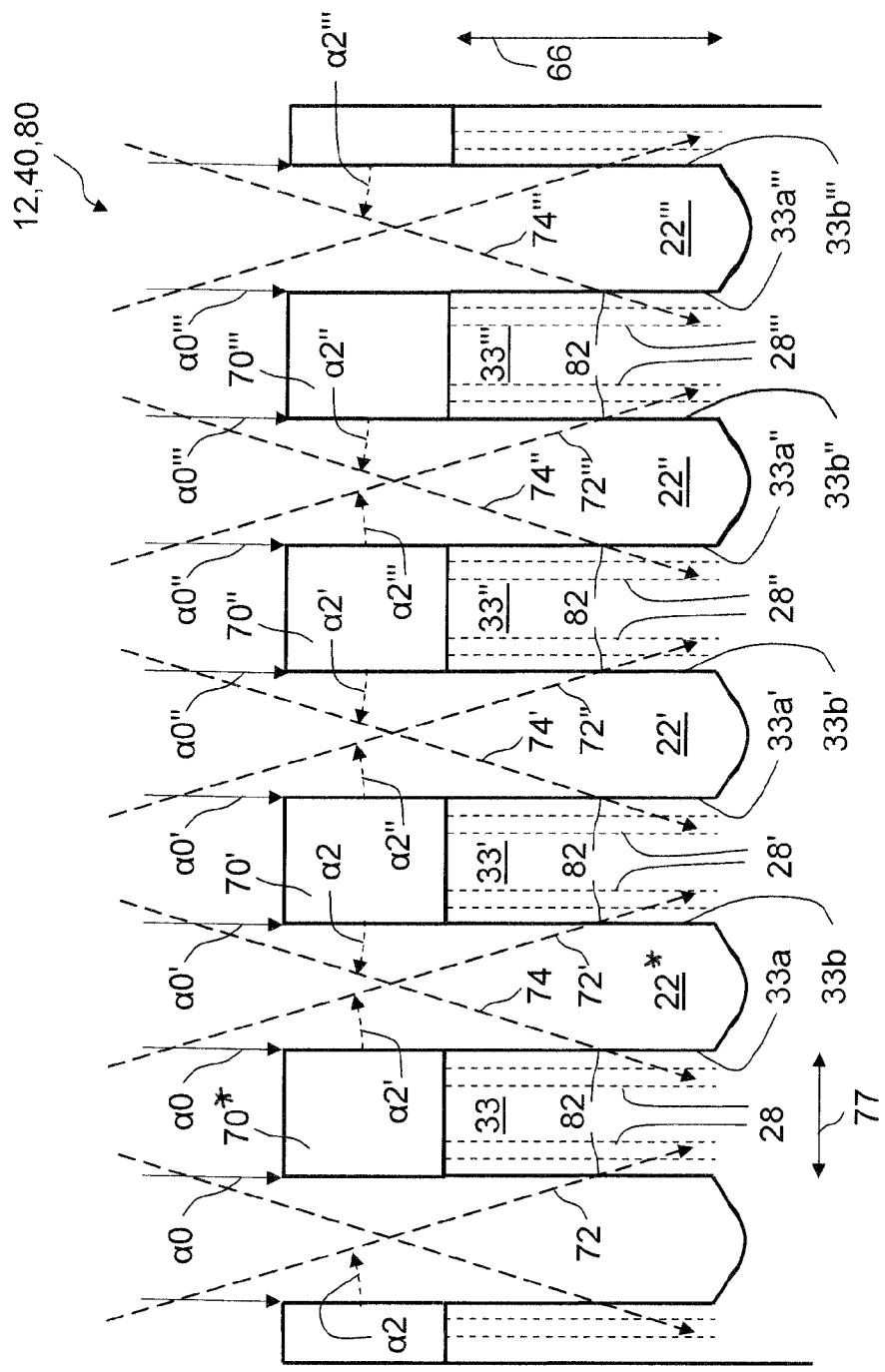
FIG. 3b shows schematically the cross-section of FIG. 3a, wherein in addition each of the walls has a second implantation doping.

FIG. 3b shows schematically the cross-section of FIG. 3a, wherein in addition each of the walls 33 has a second implantation doping 28. The first implantation step 126 at lower energies may be used for setting the surface doping 26 of the lateral trench gate 42 for adjusting a threshold voltage $V_{th}$. The second implantation step 128 at higher energies may be employed for setting a doping 28 of a volume of each wall 33 for adjusting at least one of a snap-back and a punch-through behavior. In the second step of implantation doping 128 energy may be employed which is greater or lower than a first energy employed in the first step of implantation doping 126. The ion beams 72, 74 are used for doping the walls 33 of the trenches 22 in the second step of implantation doping 128 using a second energy. The ion beams 72, 74 illustrate a second step of implantation doping 128 using second energy, which may be greater than the first energy.

With this technique a high volume doping concentration 62 for a big electrical SOA (safe operating area) and a high punch-through voltage can be realized, while still being able to adjust $V_{th}$ to the desired value. The SOA defines the combined ranges of drain current $I_d$ and drain to source voltage the MOSFET 12 is able to handle without damage. Both drain current $I_d$ and drain to source voltage should stay below their respective maximum values, but their product should also stay below the maximum power dissipation the device is able to handle. Thus the device cannot be operated at both its specified maximum drain current $I_d$ and maximum drain to source voltage.

A focus 81 of implantation doping of the first step of implantation doping 126 may be located at a greater or smaller depth 76 on the at least one wall 33 of the at least one trench 22 than a focus 82 of implantation doping of the second step of implantation doping 128.

Using a different first $\beta_1$ (beta$_1$) and second $\beta_2$ (beta$_2$) azimuth each surface 33a, 33b of each wall 33, respectively each inner face 33a, 33b of each trench 22 can be irradiated for implantation doping 126, 128. In other words, a set of implants with at specific first $\alpha_1$ and second $\alpha_2$ tilt angles and with specific first $\beta_1$ and second $\beta_2$ azimuths may be performed. The first azimuth $\beta_1$ may be defined as an angle $\beta_1$ between a slot-direction 130 of the at least one trench 22 and a direction of an implantation beam 71, 72. The second azimuth $\beta_2$ may be defined as an angle $\beta_2$ between the slot-direction $\beta_0$ of the at least one trench 22 and a direction of an implantation beam 72, 74. The two azimuths $\beta_1$, $\beta_2$ may be same in absolute value but different in sign.

Figure 6:
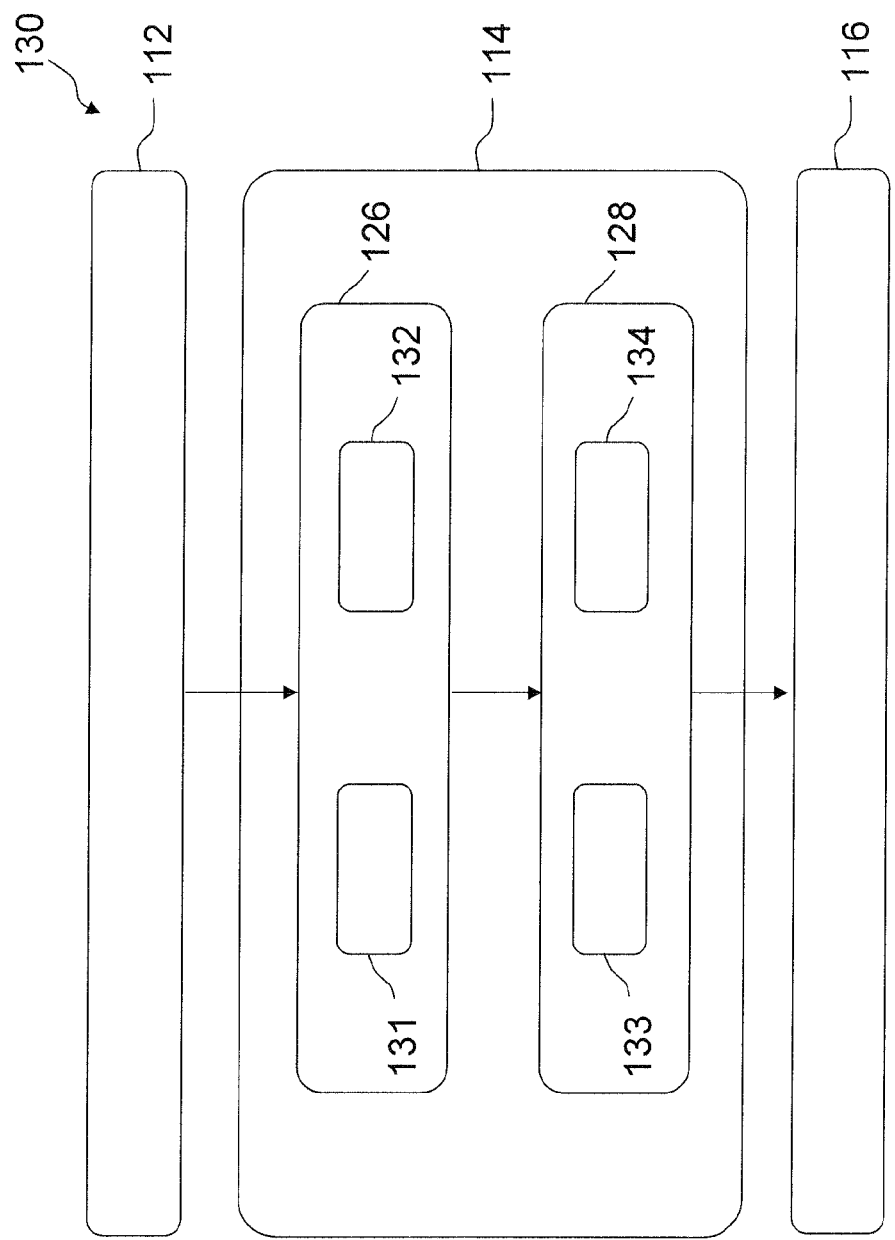
FIG. 6 shows schematically a flow diagram of a third embodiment of a manufacturing method of the example transistor.

As illustrated in FIG. 6, the first step of implantation doping 126 may be performed with a first azimuth $\beta_1$ (step 131) and then repeated (step 132) with a second azimuth $\beta_2$. Subsequently the second step of implantation doping 128 may be either at first performed with the first azimuth $\beta_1$ (step 133) and then repeated (step 134) with the second azimuth $\beta_2$. Or the second step of implantation doping 128 may be at first performed with the second azimuth $\beta_2$ (step 134) and then repeated with the first azimuth $\beta_1$ (step 133).

Figure 7:
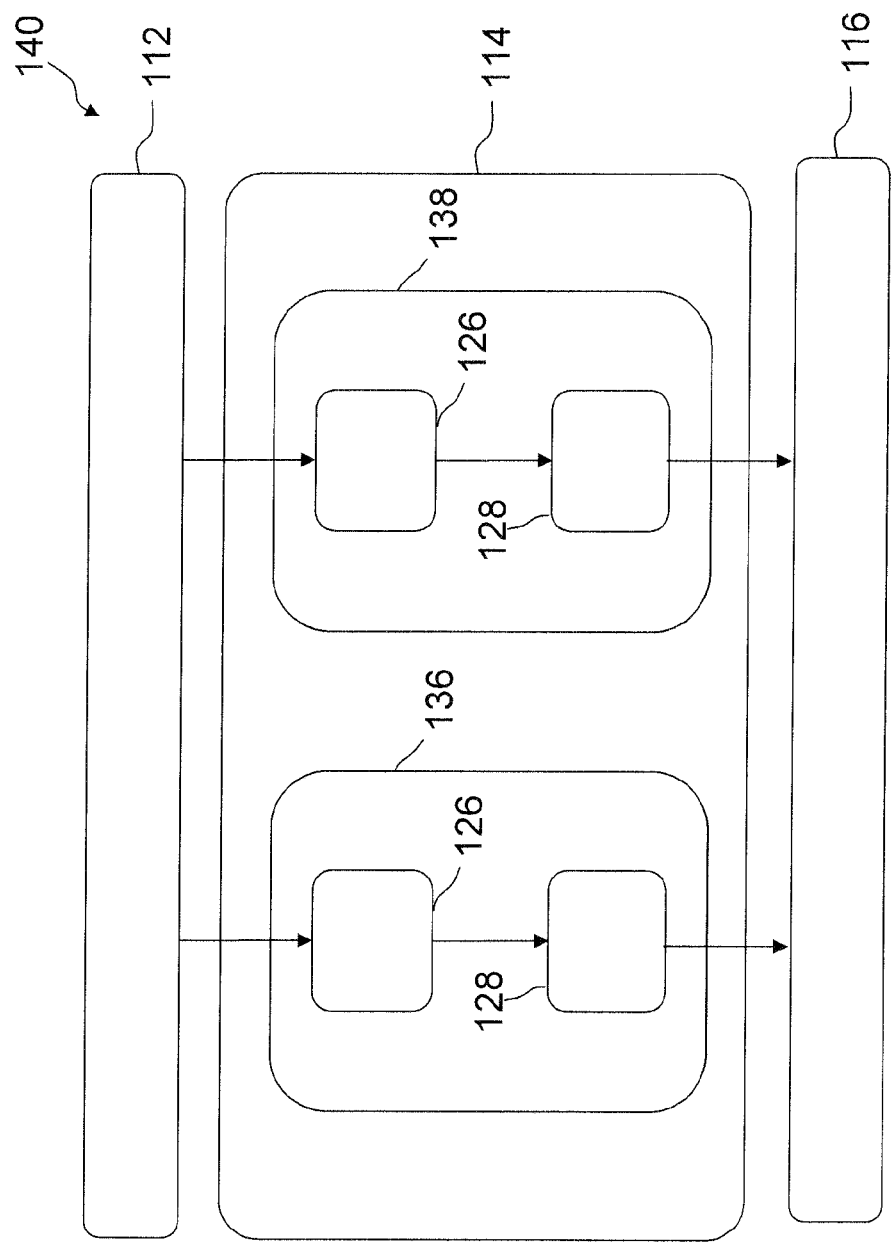
FIG. 7 shows schematically a flow diagram of a fourth embodiment of a manufacturing method of the example transistor.

As illustrated in FIG. 7, in a step 136, the first implantation doping 126 and subsequently the second implantation doping 128 may be at first performed with a first azimuth $\beta_1$. Then, the first implantation doping 126 and subsequently the second implantation doping 128 may be repeated with a second azimuth $\beta_2$ (step 138).

A first tilt angle $\alpha_1$ may be defined as an angle $\alpha_1$ between a depth-direction $\alpha_0$ of the at least one trench 22 and a direction of a first implantation beam 71, 73. A second tilt angle $\alpha_2$ may be defined as an angle $\alpha_2$ between the depth-direction $\alpha_0$ of the at least one trench 22 and a direction of a second implantation beam 72, 74. The tilt angle $\alpha_2$ of the beams 72, 74 of the second implantation doping 128 may have a same value as the tilt angle $\alpha_1$ used with the first implantation doping 126. As an alternative, the second tilt angle $\alpha_2$ may be greater or smaller than the first tilt angle $\alpha_1$.

Figure 3C:
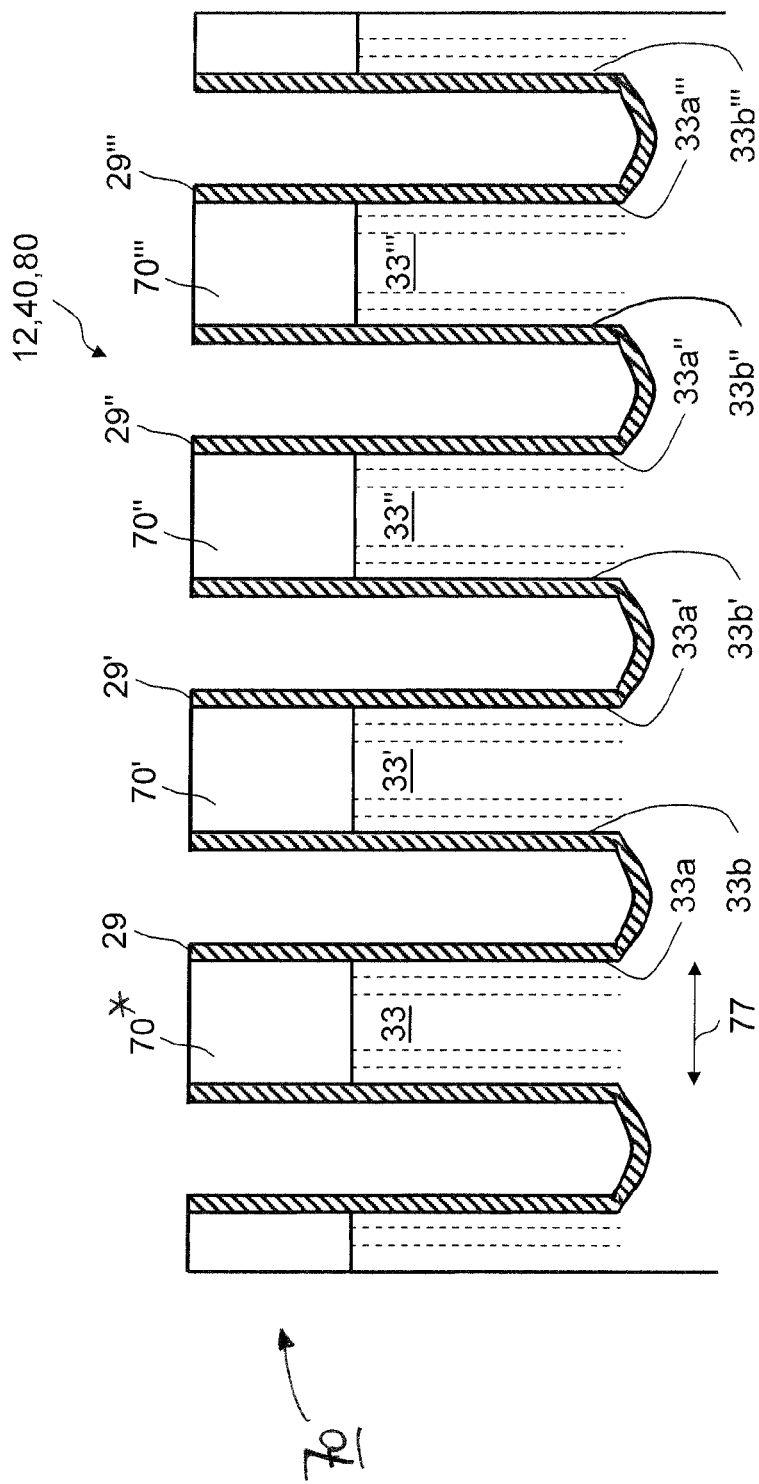
FIG. 3c shows schematically the cross-section of FIG. 3b, wherein in addition the walls are covered by an insulating layer.

FIG. 3c shows schematically the cross-section of FIG. 3b, wherein in addition the inner faces 33a, 33b of the trenches 22 (surface of the walls 33) are covered by the insulating layer 29. The insulating layer 29 may be made of gate oxide 29.

Figure 4:
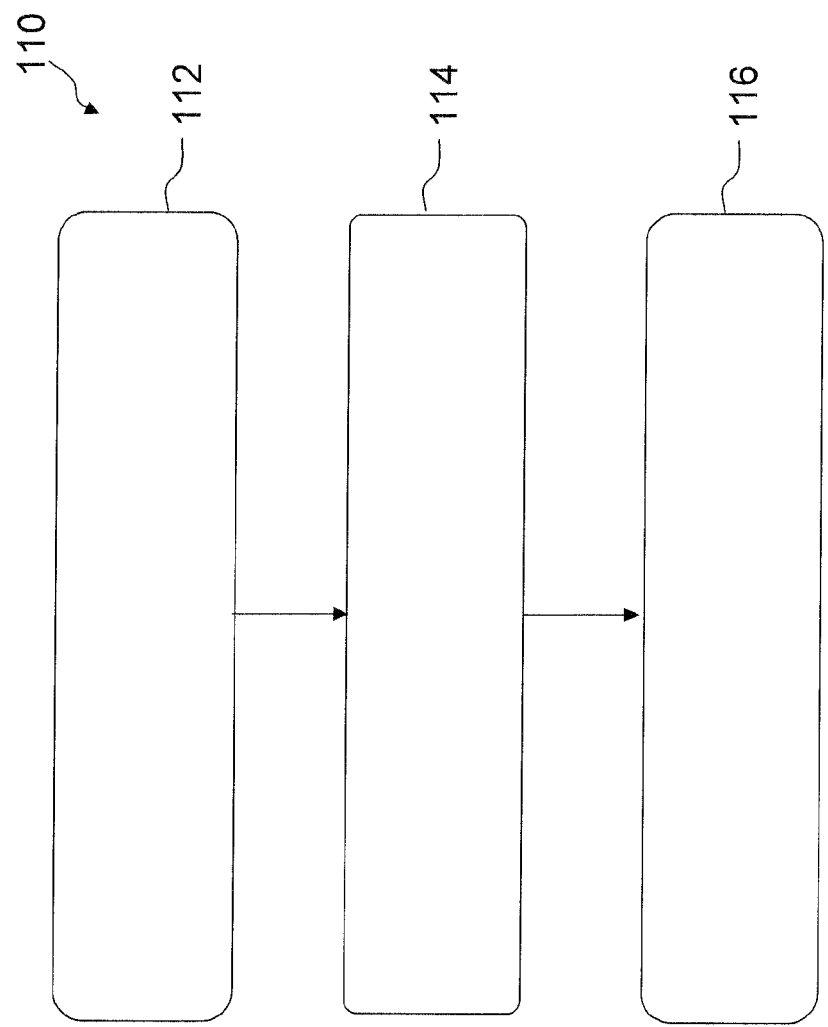
FIG. 4 shows schematically a flow diagram of a first embodiment of a manufacturing method of the example transistor.

FIG. 4 shows schematically a flow diagram of a first example embodiment 110 of a manufacturing method of manufacturing 110, 120, 130, 140 the semiconductor device 12. This method of manufacturing comprises the steps of: forming at least one wall 33 of a body 44 of the semiconductor device 12 by etching at least one trench 22 for a gate 42 of the semiconductor device 12 into the body 44 (step 112), and performing a slanted implantation doping into at least one wall 33 of the body 44 (step 114), after the etching 112 of the at least one trench 22 and prior to coating (step 116) the at least one trench 22 with an insulating layer 29. This method facilitates a substantially uniform doping concentration profile 62 along the inner faces 33a, 33b of the trench 22 of the lateral trench gate 42, because the implantation conditions may be set continuous in any vertical direction of the walls 33 of lateral trench gates 42. The resulting doping concentration profile 62 is vertically much more uniform compared to the conventional doping concentration profiles 90, 92 of the conventional multi implant and diffused doping.

Figure 5:
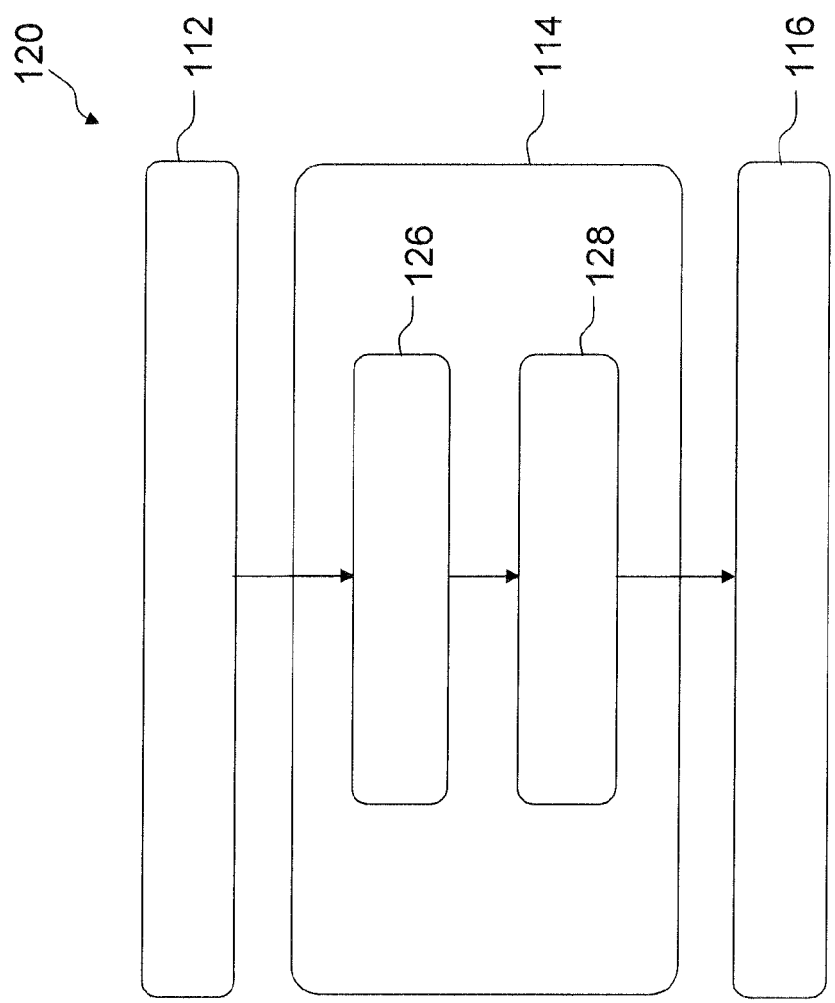
FIG. 5 shows schematically a flow diagram of a second embodiment of a manufacturing method of the example transistor.

FIG. 5 shows schematically a flow diagram of a second example embodiment 120 of a manufacturing method of manufacturing the semiconductor device 12. The step 114 of performing the implantation doping 26, 28 into the at least one wall 33 may comprise a first 126 and a second 128 step of implantation doping. In the second step of implantation doping 128 energy may be employed which is greater or lower than energy employed in the first step of implantation doping 126. This also applies to the third 130 to fourth 140 embodiments illustrated in FIGS. 6 and 7.

As explained with FIGS. 3a and 3b, the step 114 of performing the implantation doping 26, 28 into the wall 33 may be performed with at least two different first $\beta_1$ and second $\beta_2$ azimuths. Variations of sequence of the method steps 126, 128, 131, 132, 133, 134, 136, and 138 have been discussed above within the description part for FIG. 3b.

FIG. 6 shows schematically a flow diagram of a third example embodiment 130 of a manufacturing method for manufacturing the semiconductor device 12. Whether in at least one of the first 126 and second 128 implantation steps the implantation doping 26, 28 may be performed simultaneously for both azimuths $\beta_1$ and $\beta_2$, or must be performed subsequently, may dependent on capabilities of the employed manufacturing equipment.

FIG. 7 shows schematically a flow diagram of a fourth example embodiment 140 of a manufacturing method for manufacturing the semiconductor device 12.

The step 114 of performing the implantation doping 26, 28 into the wall 33 may be performed with at least two different first $\alpha_1$ and second $\alpha_2$ tilt angles.

The semiconductor device 12 may be one of an IGBT (insulated-gate bipolar transistor) or other type of transistor, in particular an IGFET (insulated-gate field-effect transistor) or a MOSFET. The MOSFET may be a super-junction MOSFET and a lateral double diffused MOSFET.

Figure 8:
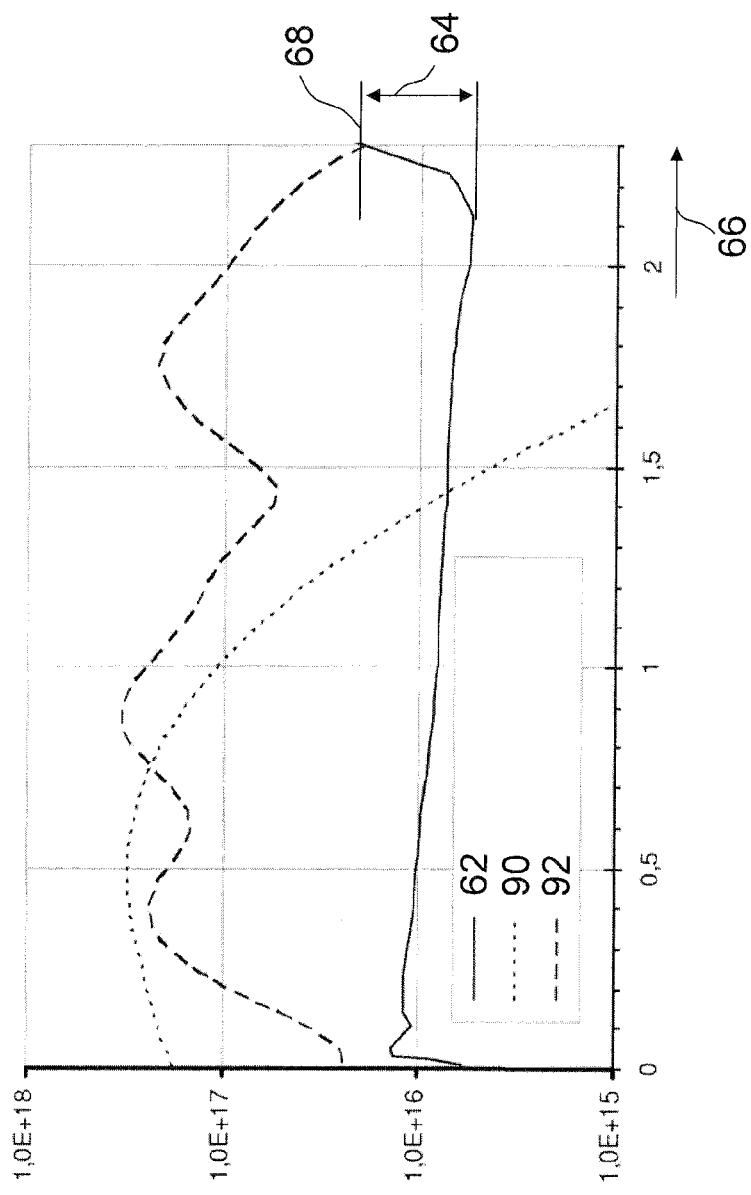
FIG. 8 shows a comparison of simulated doping concentration profiles along trench depth in a surface of a wall of one of the trenches.
Figure 9:
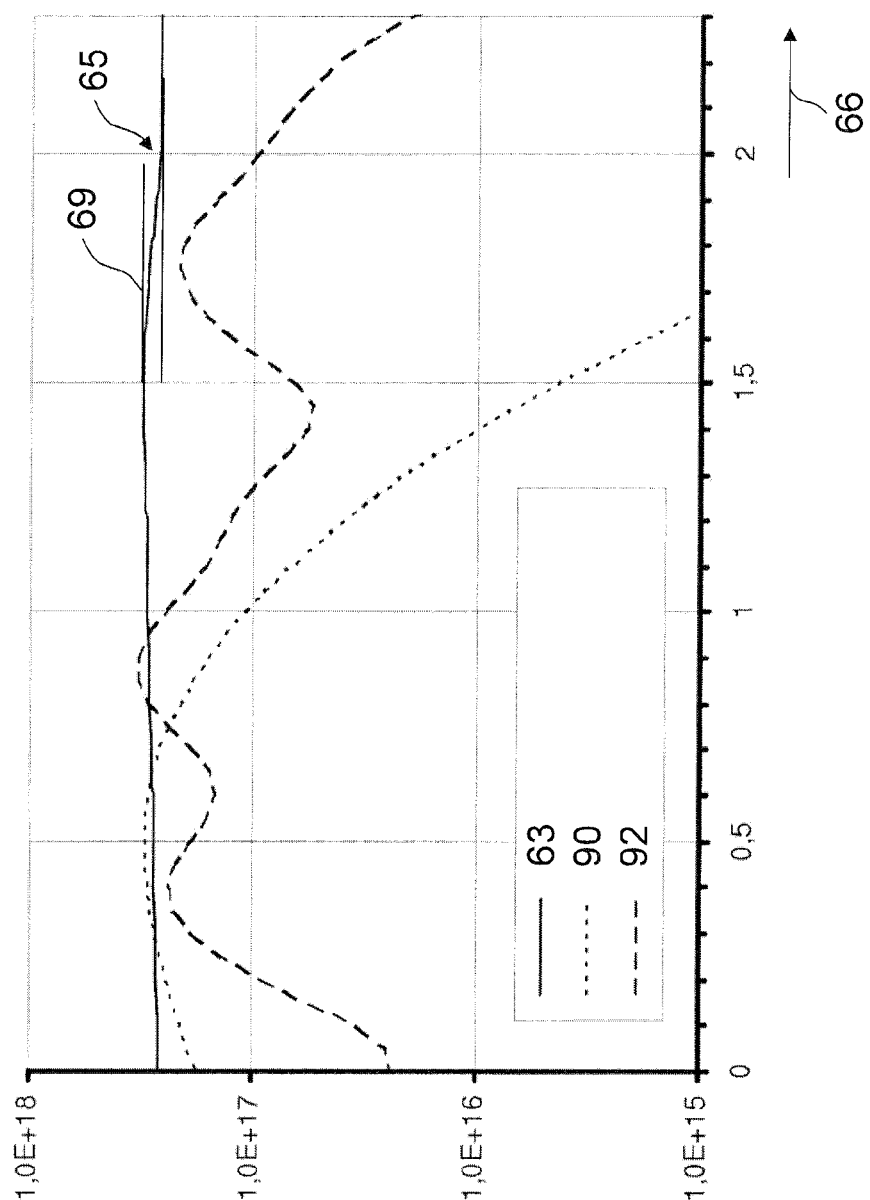
FIG. 9 shows a comparison of simulated doping concentration profiles along the trench depth inside a volume of a wall of one of the trenches.

FIGS. 8 and 9 show simulated doping concentration profiles 90, 92 of prior art lateral trench gate bodies compared to doping concentration profiles 62, 63 formed according to examples of the invention. The curve 90 shows a doping concentration profile resulting from conventional diffusion. The curve 92 shows a doping concentration profile resulting from conventional multiple implantations. The figures indicate that the examples of claimed invention provides independent control of doping concentration in the surfaces 33a, 33b of a wall 33 and of doping concentration in the volume of the wall 33, as well as an improved uniformity of the doping concentrations FIG. 8 shows a comparison of simulated doping concentration profiles 62, 94 along trench depth 30 in the surface 33a, 33b of a wall 33 of one of the trenches 22. Hence, a deviation 64 of a doping concentration 62 along a distance 66 in depth-direction $\alpha_0$ of the at least one trench 22 in a surface 33 of the at least one wall 33 may be less than 10% of a maximum value 68 of the doping concentration profile 62 along the distance 66. In particular, the deviation 64 of the doping concentration 62 along said distance 66 may be less than 8%, in particular less than 4%, in particular less than 2% of the maximum value 68 of the doping concentration profile 62 along said distance 66.

FIG. 9 shows a comparison of simulated doping concentration profiles 63, 92, 94 along a distance 66 transverse or in parallel to a depth-direction $\alpha_0$ of the trench 22 inside the volume of a wall 33 of one of the trenches 22. Hence, a deviation 65 of a doping concentration 63 inside a volume of the at least one wall 33 along a distance 66 transverse or in parallel to a depth-direction $\alpha_0$ of the at least one trench 22 may be less than 10% of a maximum value 69 of the doping concentration profile 63 inside the volume of the at least one wall 33 along the distance 66. In particular, the semiconductor device 12 of claim 13, wherein the deviation 65 of the doping concentration 63 inside the volume of the at least one wall 33 along said distance 66 may be less than 8%, in particular less than 4%, in particular less than 2% of the maximum value 69 of the doping concentration profile 63 along said distance 66.

The examples of the invention allow a substantially uniform surface doping 62 along the surfaces 33a, 33b of the walls 33 of the lateral trench gate 42 providing a good control of the threshold voltage $V_{th}$. All examples further allow a doping high concentration profile 62 deep inside the wall 33 for good electrical SOA as well as a high punch-through voltage. Independent control of the threshold voltage $V_{th}$ and snap-back for the transistor 12 is provided. The examples allow forming deep lateral trench gates 42 without limitation of high temperature drive-in steps or the maximum energy of a given ion implantation tool. The examples of the method are cost-effective as do not require a dedicated lithography mask layer for the body doping 62.

For manufacturing a corresponding complementary transistor in PMOS technology, corresponding complementary manufacturing methods may be employed.

The invention claimed is:

1. A method of manufacturing a semiconductor device (12) comprising the steps (112, 114, 116) of
    forming at least one wall (33) of a body (44) of the semiconductor device (12) by etching (112) at least one trench (22) for a gate (42) of the semiconductor device (12) into the body (44);
    performing a slanted implantation doping (126, 128) into the at least one wall (33) of the body (44), after the etching (112) of the at least one trench (22) and prior to coating (116) the at least one trench (22) with an insulating layer (29);
    wherein the step (114) of performing the implantation doping (126, 128) comprises a first (126) and a second (128) step of implantation doping, wherein in the second step of implantation doping (128) energy is employed which is one of greater than and lower than a first energy employed in the first step of implantation doping (126),
    wherein the first step of implantation doping (126) is performed with a first azimuth ($\beta$1) and then repeated with a second azimuth ($\beta$2),
    wherein subsequently the second step of implantation doping (128) is one of: at first performed with the first azimuth ($\beta$+1) and then repeated with the second azimuth ($\beta$2); and at first performed with the second azimuth ($\beta$2) and then repeated with the first azimuth ($\beta$1),
    wherein the first azimuth ($\beta$+1) is an angle ($\beta$+1) between a slot-direction ($\beta$0) of the at least one trench (22) and a direction of an implantation beam (71, 72),
    wherein the second azimuth ($\beta$2) is an angle ($\beta$2) between the slot-direction ($\beta$0) of the at least one trench (22) and a direction of an implantation beam (73, 74), and
    wherein the two azimuths ($\beta$+1, $\beta$2) have a same absolute value but are different in sign.

2. The method of claim 1, wherein the first step of implantation doping (126) is performed with a first tilt angle, wherein the second step of implantation doping (128) is performed with a second tilt angle, wherein the first tilt angle (α+1) is an angle (α+1) between a depth-direction of the at least one trench (22) and a direction of a first implantation beam (71, 73), and wherein the second tilt angle is an angle between the depth-direction of the at least one trench (22) and a direction of a second implantation beam (72, 74).

3. The method of claim 2, wherein the second tilt angle has the same sign as the first tilt angle, but is one of greater than and smaller than the first tilt angle.

4. The method of claim 1, wherein the semiconductor device (12) comprises a transistor.

5. The method of claim 4, wherein the transistor is chosen from the group consisting of an IGFET, an IGBT, a MOSFET, a super-junction MOSFET and a lateral double diffused MOSFET.

6. The method of claim 1, wherein the implantation doping comprises an ion implantation.

7. The method of claim 1, wherein a masking layer (70) used for the etching (112) of the at least one trench (22) is used as an implant mask (70) for performing the implantation doping.

8. The method of claim 1, wherein a focus of implantation doping of the first step of implantation doping (126) is located at one of a greater depth and a smaller depth (76) on the at least one wall (33) of the at least one trench (22) than a focus of implantation doping of the second step of implantation doping.

9. A method of manufacturing a semiconductor device (12) comprising the steps (112, 114, 116) of
forming at least one wall (33) of a body (44) of the semiconductor device (12) by etching (112) at least one trench (22) for a gate (42) of the semiconductor device (12) into the body (44);
performing a slanted implantation doping (126, 128) into the at least one wall (33) of the body (44), after the etching (112) of the at least one trench (22) and prior to coating (116) the at least one trench (22) with an insulating layer (29);
wherein the step (114) of performing the implantation doping (126, 128) comprises a first (126) and a second (128) step of implantation doping, wherein in the second step of implantation doping (128) energy is employed which is one of greater than and lower than a first energy employed in the first step of implantation doping (126), wherein the first implantation doping (126) and subsequently the second implantation doping (128) are at first performed with a first azimuth (β+1), wherein the first implantation doping (26) and subsequently the second implantation doping (128) are then repeated with a second azimuth (β2), wherein the first azimuth (β1+) is an angle (β1) between a slot-direction (β0) of the at least one trench (22) and a direction of an implantation beam (71, 72), wherein the second azimuth (β2) is an angle (β2) between the slot-direction (β0) of the at least one trench (22) and a direction of an implantation beam (73, 74), and wherein the two azimuths (β+1, β2) have a same absolute value but are different in sign.

10. The method of claim 9, wherein the implantation doping comprises an ion implantation.

11. The method of claim 9, wherein a masking layer (70) used for the etching (112) of the at least one trench (22) is used as an implant mask (70) for performing the implantation doping.

12. The method of claim 9, wherein a focus of implantation doping of the first step of implantation doping (126) is located at one of a greater depth and a smaller depth (76) on the at least one wall (33) of the at least one trench (22) than a focus of implantation doping of the second step of implantation doping.

13. The method of claim 9, wherein the first step of implantation doping (126) is performed with a first tilt angle, wherein the second step of implantation doping (128) is performed with a second tilt angle, wherein the first tilt angle is an angle between a depth-direction of the at least one trench (22) and a direction of a first implantation beam, and wherein the second tilt angle is an angle between the depth-direction of the at least one trench (22) and a direction of a second implantation beam.

14. The method of claim 13, wherein the second tilt angle has the same sign as the first tilt angle, but is one of greater than and smaller than the first tilt angle.

15. The method of claim 9, wherein the semiconductor device (12) comprises a transistor.

16. The method of claim 15, wherein the transistor is chosen from the group consisting of an IGFET, an IGBT, a MOSFET, a super-junction MOSFET and a lateral double diffused MOSFET.

* * * * *

UNITED STATES PATENT AND TRADEMARK OFFICE
CERTIFICATE OF CORRECTION

PATENT NO. : 8,841,186 B2
APPLICATION NO. : 13/582142
DATED : September 23, 2014
INVENTOR(S) : Hoelke et al.

It is certified that error appears in the above-identified patent and that said Letters Patent is hereby corrected as shown below:

In the Claims

Col. 8 line 32-64 claim 1 should read,

1. A method of manufacturing a semiconductor device (12) comprising the steps (112, 114, 116) of
    forming at least one wall (33) of a body (44) of the semiconductor device (12) by etching (112) at least one trench (22) for a gate (42) of the semiconductor device (12) into the body (44);
    performing a slanted implantation doping (126, 128) into the at least one wall (33) of the body (44), after the etching (112) of the at least one trench (22) and prior to coating (116) the at least one trench (22) with an insulating layer (29);
    wherein the step (114) of performing the implantation doping (126, 128) comprises a first (126) and a second (128) step of implantation doping, wherein in the second step of implantation doping (128) energy is employed which is one of greater than and lower than a first energy employed in the first step of implantation doping (126),
    wherein the first step of implantation doping (126) is performed with a first azimuth (β1) and then repeated with a second azimuth (β2), wherein subsequently the second step of implantation doping (128) is one of: at first performed with the first azimuth (β1) and then repeated with the second azimuth (β2); and at first performed with the second azimuth (β2) and then repeated with the first azimuth (β1), wherein the first azimuth (β1) is an angle (β1) between a slot-direction (β0) of the at least one trench (22) and a direction of an implantation beam (71, 72), wherein the second azimuth (β2) is an angle (β2) between the slot-direction (β0) of the at least one trench (22) and a direction of an implantation beam (73, 74), and wherein the two azimuths (β1, β2) have a same absolute value but are different in sign.

Col. 9 & Col. 10 line 28-13 claim 9 should read,

9. A method of manufacturing a semiconductor device (12) comprising the steps (112, 114, 116) of
    forming at least one wall (33) of a body (44) of the semiconductor device (12) by etching (112) at least one trench (22) for a gate (42) of the semiconductor device (12) into the body (44);

Signed and Sealed this
Twenty-first Day of July, 2015

Michelle K. Lee
*Director of the United States Patent and Trademark Office* performing a slanted implantation doping (126, 128) into the at least one wall (33) of the body (44), after the etching (112) of the at least one trench (22) and prior to coating (116) the at least one trench (22) with an insulating layer (29);

wherein the step (114) of performing the implantation doping (126, 128) comprises a first (126) and a second (128) step of implantation doping, wherein in the second step of implantation doping (128) energy is employed which is one of greater than and lower than a first energy employed in the first step of implantation eloping (126), wherein the first implantation doping (126) and subsequently the second implantation doping (128) are at first performed with a first azimuth (β1), wherein the first implantation doping (126) and subsequently the second implantation doping (128) are then repeated with a second azimuth (β2), wherein the first azimuth (β1) is an angle (β1) between a slot-direction (β0) of the at least one trench (22) and a direction of an implantation beam (71, 72), wherein the second azimuth (β2) is an angle (β2) between the slot-direction (β0) of the at least one trench (22) and a direction of an implantation beam (73, 74), and wherein the two azimuths (β1, β2) have a same absolute value but are different in sign.